(12) United States Patent
Hichri (10) Patent No.: US 9,779,932 B2
(45) Date of Patent: Oct. 3, 2017

(54) SACRIFICIAL LAYER FOR POST-LASER DEBRIS REMOVAL SYSTEMS

(71) Applicant: SUSS MicroTec Photonic Systems Inc., Corona, CA (US)

(72) Inventor: Habib Hichri, Irvine, CA (US)

(73) Assignee: SUSS MicroTec Photonic Systems Inc., Corona, CA (US)

( * ) Notice: Subject to any disclaimer, the term of this patent is extended or adjusted under 35 U.S.C. 154(b) by 0 days.

(21) Appl. No.: 14/967,121

(22) Filed: Dec. 11, 2015

(65) Prior Publication Data

US 2017/0170003 A1 Jun. 15, 2017

(51) Int. Cl.
| | |
|---|---|
| *H01L 21/00* | (2006.01) |
| *H01L 21/02* | (2006.01) |
| *B23K 26/40* | (2014.01) |
| *H01L 21/311* | (2006.01) |
| *B23K 26/142* | (2014.01) |
| *B23K 26/36* | (2014.01) |
| *H01L 21/31* | (2006.01) |

(52) U.S. Cl.
CPC ........ *H01L 21/0206* (2013.01); *B23K 26/142* (2015.10); *B23K 26/36* (2013.01); *B23K 26/40* (2013.01); *H01L 21/02096* (2013.01); *H01L 21/02354* (2013.01); *H01L 21/31* (2013.01); *H01L 21/31105* (2013.01); *H01L 21/31127* (2013.01); *H01L 21/31144* (2013.01)

(58) Field of Classification Search
CPC .................................................. H01L 21/0206
USPC .......................................................... 438/759
See application file for complete search history.

(56) References Cited

U.S. PATENT DOCUMENTS

| | | | |
|---|---|---|---|
| 6,242,156 B1 * | 6/2001 | Teng ..................... | B41C 1/1033 101/454 |
| 8,728,933 B1 * | 5/2014 | Andres ................... | H01L 31/18 257/E21.409 |
| 8,778,780 B1 * | 7/2014 | Doan ....................... | H01S 5/00 257/14 |
| 2002/0122925 A1 * | 9/2002 | Liu ........................... | C08F 2/44 428/212 |
| 2006/0205182 A1 | 9/2006 | Soejima | |
| 2008/0121906 A1 * | 5/2008 | Yakushiji ............. | H01L 33/0095 257/94 |
| 2008/0158535 A1 * | 7/2008 | Goldstein .............. | B82Y 10/00 355/67 |
| 2008/0194051 A1 * | 8/2008 | Chu ..................... | H01L 33/0095 438/33 |
| 2009/0179354 A1 * | 7/2009 | Lizotte .................... | H01M 4/04 264/400 |
| 2010/0304551 A1 | 12/2010 | Takanashi et al. | |
| 2014/0273401 A1 | 9/2014 | Lei et al. | |
| 2015/0179538 A1 | 6/2015 | Shinjo et al. | |

* cited by examiner

*Primary Examiner* — Jami M Valentine (74) *Attorney, Agent, or Firm* — Haynes and Boone, LLP (57) ABSTRACT

A method of removing post-laser debris from a wafer includes, for an embodiment, forming a sacrificial layer over a layer to be patterned, patterning the sacrificial layer and the layer to be patterned using laser ablation, and removing the sacrificial layer and debris deposited on the sacrificial layer with water. The sacrificial layer includes a water soluble binder and a water soluble ultraviolet (UV) absorbent. Systems for removing the post-laser debris are also described.

28 Claims, 8 Drawing Sheets

SACRIFICIAL LAYER FOR POST-LASER DEBRIS REMOVAL SYSTEMS

BACKGROUND

Technical Field

This application relates to techniques for fabricating electronics substrates and semiconductor wafers in general, and more particularly, for example, to methods for patterning layers on such substrates and wafers using lasers and removing post-laser debris.

Related Art

Laser ablation describes the removal of materials using high photon energies (i.e. short wavelengths, and not necessarily high intensities) and is a very effective method of patterning polymers. Typically, ultraviolet (UV) light strikes the polymer at moderate intensities such that the combination of photochemical and photothermal effects dissociates the polymer chain into smaller, volatile molecules that are removed with a debris removal system. In addition to the successful removal of polymers such as polyimide, laser ablation can be used to remove metals and inorganic materials.

Laser ablation can be a cost-effective patterning method since high-resolution features can be patterned without photosensitive mediums, developers, or etchants. For example, laser ablation has been successfully used to pattern materials with a resolution limit of less than 5 µm. The laser ablation rate is a function of wavelength, pulse width, and fluence, so the ablation rate can be precisely controlled.

Laser ablation has been successfully demonstrated with excimer lasers, which have become the staple of microlithography in the past two decades. Excimer lasers are the most powerful UV laser sources, and usually contain a rare-gas and a halogen or halogen-bearing gas. Popular excimer laser gases are KrF (248 nm), and ArF (193 nm). Unlike other lasers, the excimer laser produces speckle-free and incoherent light, which is ideal for high-resolution lithography. Because excimer lasers emit light efficiently in the UV spectrum, have a large beam size, and are readily available for microlithography, they are ideally suited for laser ablation.

The laser ablation process, however, creates debris (particles of material ejected during patterning) on the surface of the material that needs to be removed. This debris contaminates the substrate and may cause difficulties with subsequent steps. Current materials used on the substrate to remove debris may not absorb the UV radiation from the laser or withstand laser scanning of a full die, and can peel, reducing their efficacy to clear debris from the surface.

Many products have been commercialized for the purpose of removal of UV laser ablation debris. These materials were mostly used for UV laser ($CO_2$) or solid state lasers such as diode-pumped solid-state (DPSS) lasers where the process is performed one via or one line at a time. These materials such as EMC 1146 protective coating for laser scribing (commercially available from Emulsitone Chemicals, LLC), Daecoat products (commercially available from John Moore Consulting), or HogoMax products (commercially available from DISCO Corporation) did not work effectively when used with mask scanning systems utilizing the excimer laser process. These materials could only be used effectively with spot shot ablation, and do not have enough UV absorption capability. Therefore, they lift or peel off when exposed to a scan beam during an excimer laser ablation process.

Many other research institutions have proposed the use of a thin layer of photoresist material as a sacrificial layer. The cost and use of solvent, however, make this option unattractive in high volume manufacturing.

Accordingly, there is a need for improved materials and methods for the removal of post-laser debris.

SUMMARY

In accordance with one or more embodiments of the present invention, systems and methods are provided for removing post-laser debris that may avoid or reduce the above and other drawbacks of the prior art.

In one example embodiment, a method of removing post-laser debris from a wafer includes forming a sacrificial layer over a layer to be patterned, wherein the sacrificial layer comprises a water soluble binder and a water soluble ultraviolet (UV) absorbent; patterning the sacrificial layer and the layer to be patterned using laser ablation; and removing the sacrificial layer and debris deposited on the sacrificial layer with water.

In another embodiment, a method of removing post-laser debris from a wafer includes combining a water soluble binder and a water soluble ultraviolet (UV) absorbent to form a solution; applying the solution on a dielectric, glass, or metal layer to form a sacrificial layer; patterning the sacrificial layer and the dielectric, glass, or metal layer using laser ablation; and removing the sacrificial layer and debris deposited on the sacrificial layer with water.

In another embodiment, a method of removing post-laser debris from a wafer includes forming a solution comprising a water soluble binder and a water soluble ultraviolet (UV) absorbent; forming a sacrificial layer on a dielectric layer; patterning the sacrificial layer and the dielectric layer using excimer laser ablation; and removing debris deposited on the sacrificial layer and the sacrificial layer with a water spray.

In another embodiment, a method of removing post-laser debris from a wafer includes forming a solution comprising a water soluble binder and a water soluble ultraviolet (UV) absorbent; forming a sacrificial layer on a dielectric layer; patterning the sacrificial layer and the dielectric layer using excimer laser ablation; removing debris deposited on the sacrificial layer and the sacrificial layer with a water spray; and rinsing the dielectric layer with an alcohol (such as isopropanol or ethanol).

A better understanding of the above and other features and advantages of the systems and methods of the present invention can be made from a consideration of the detailed description of some example embodiments thereof below, particularly if such consideration is made in conjunction with the appended drawings, wherein like reference numerals are used to identify like elements illustrated in one or more of the figures thereof.

DETAILED DESCRIPTION

A sacrificial layer is described to remove debris in accordance with one or more embodiments. The sacrificial layer includes a thin water soluble film that is capable of absorbing the UV light during laser ablation such as scan ablation or spot shots ablation, and being ablated with the layer that is to be patterned. The sacrificial layer is easily removed with water after the ablation process. The removal of the sacrificial layer carries with it all the debris deposited during ablation. This results in clean, ablated features that are ready for subsequent processes. The described methods may be used on full dies or macros used in the semiconductor industry, and on dielectric materials used for advanced semiconductor packaging application, including formation of vias, bumps, redistributed layers, line and space ablation, or a combination of via and redistributed layers ablated simultaneously as a dual damascene process flow.

The sacrificial layer includes at least two components: (1) a water soluble binder and (2) a water soluble UV absorbent. The water soluble binder is any suitable binder that is stable when exposed to UV light. The water soluble UV absorbent is any suitable absorbent that binds with the binder, exhibits photo-stability, and is thermally stable when exposed to UV light. The components are chosen to form a sacrificial layer that has little to no reaction with other layers on the substrate. The sacrificial layer formed when the binder and UV absorbent are mixed absorbs UV light and can also be used to pattern multiple features on the substrate without peeling or lift off. The sacrificial layer forms a film that is about 0.2 to 5 microns thick. In various embodiments, the film is about 0.5 to 2 microns thick, and in other embodiments, the film is about 1 to 1.5 microns thick.

Suitable binders include, but are not limited to, polyvinyl alcohol (PVA), polyvinylpyrrolidone (PVP), polyethylene oxide (PEO), polyacrylic materials, such as polyacrylic acid, ethyl cellulose, and methyl ester, or any other water soluble polymer. Suitable UV absorbents include, but are not limited to benzotriazole and triazine based UV absorbent materials such as Tinuvin® 400-DW, Tinuvin® 477-DW, and Tinuvin® 99-DW Binders that exhibit improved thermal stability are the water soluble PEO polymers. Polyox™ WSR N-750 and Polyox™ WSR N-3000 are suitable binders and are both commercially available from The Dow® Chemical Company. A mixture of a solution containing about 1-10% by weight of PEO mixed with a water soluble UV absorbent material, such as Tinuvin® 400-DW solution (a liquid hydroxyphenyl-triazine commercially available from BASF) was demonstrated to be effective as a sacrificial layer to remove post ablation debris with a simple water wash step. In several embodiments, the ratio of the binder to the UV absorbent in the sacrificial layer ranges from about 30:1 to about 5:1. In other embodiments, the ratio of the binder to the UV absorbent in the sacrificial layer ranges from about 15:2 to about 10:1.

An exemplary embodiment of the present invention will now be described with reference to the accompanying drawings.

Referring to FIGS. 1 and 2A-2D, a method 100 for removing post-laser debris from a surface is described. At step 102 and FIG. 2A, a dielectric layer 205, or other material that can be patterned by laser (such as metal or glass) is formed on a substrate 200. In various embodiments, the dielectric layer is an organic dielectric film. Suitable patterning materials are known to one of ordinary skill in the art.

Figure 1:
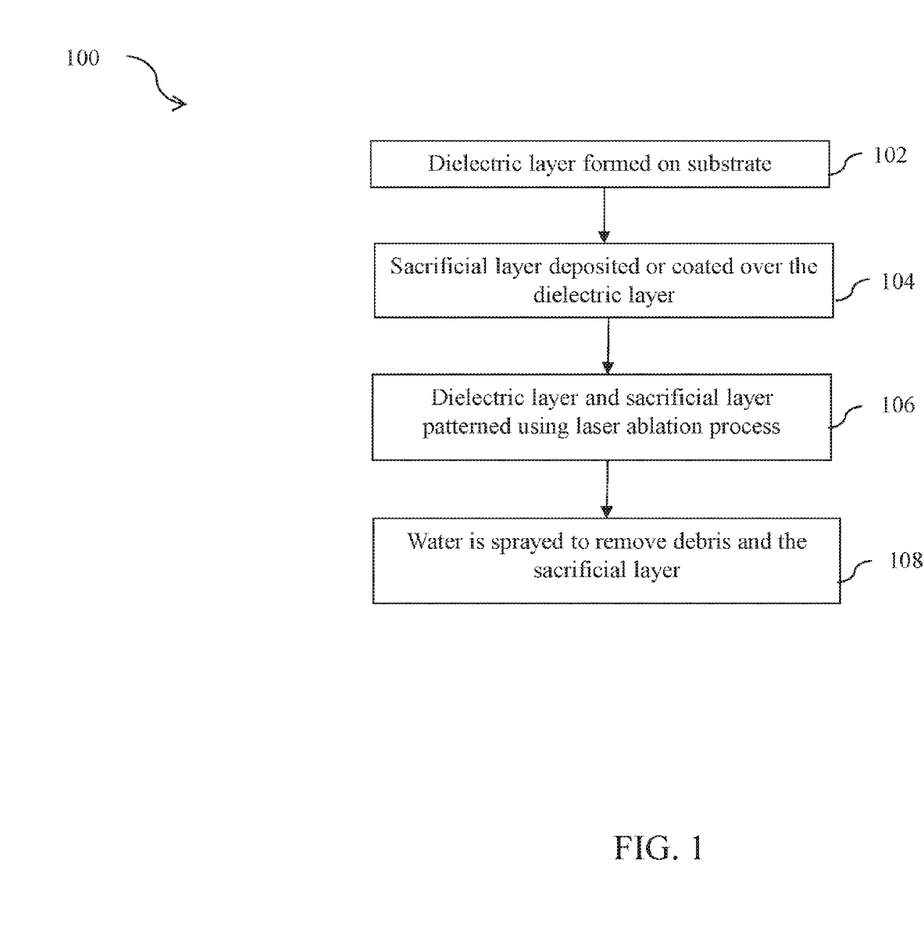
FIG. 1 is a flowchart of a method of removing post-laser debris in accordance with an embodiment of the present invention.
Figure 2A:
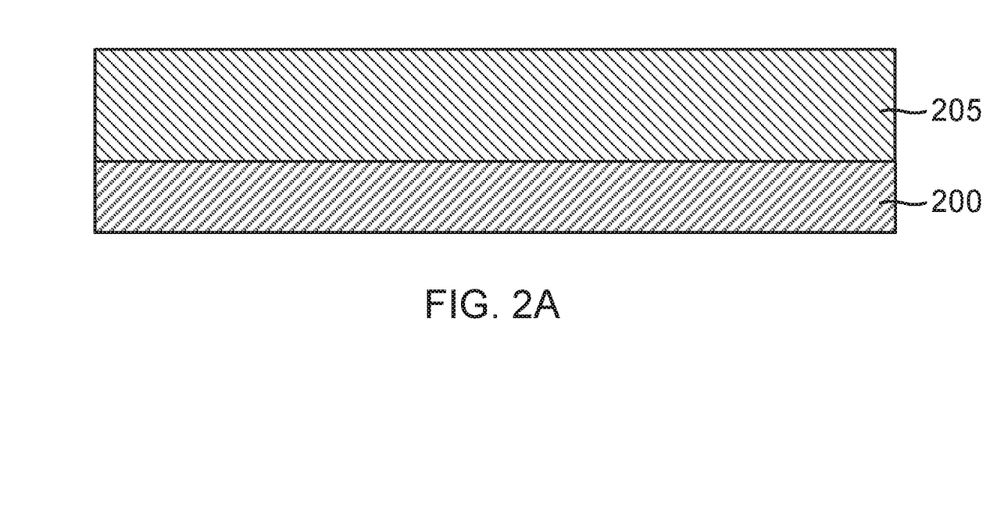
FIGS. 2A-2D are cross-sectional side views of a substrate subjected to a method of removing post laser debris in accordance with an embodiment of the present invention.
Figure 2B:
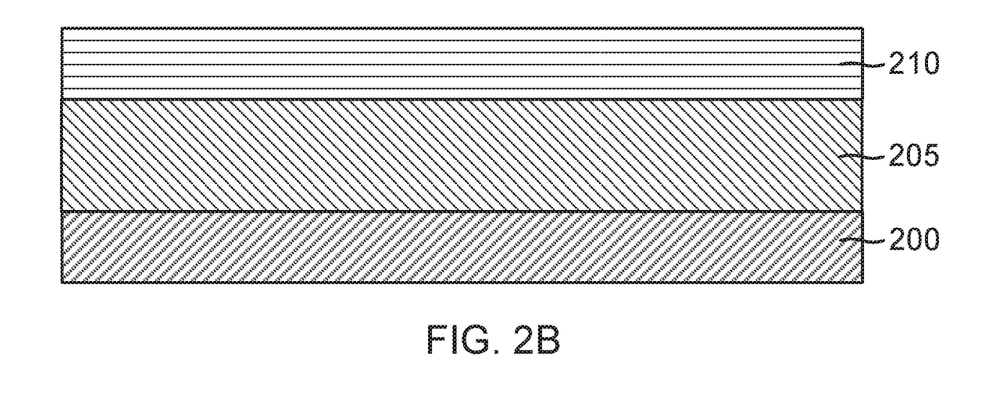

Moving to step 104 and FIG. 2B, a sacrificial layer 210 is deposited or coated over the dielectric layer 205. The sacrificial layer 210, in some embodiments, is formed on top of the dielectric layer 205 using spin coating, spray coating, or any suitable technique known to those of ordinary skill in the art.

Figure 2C:
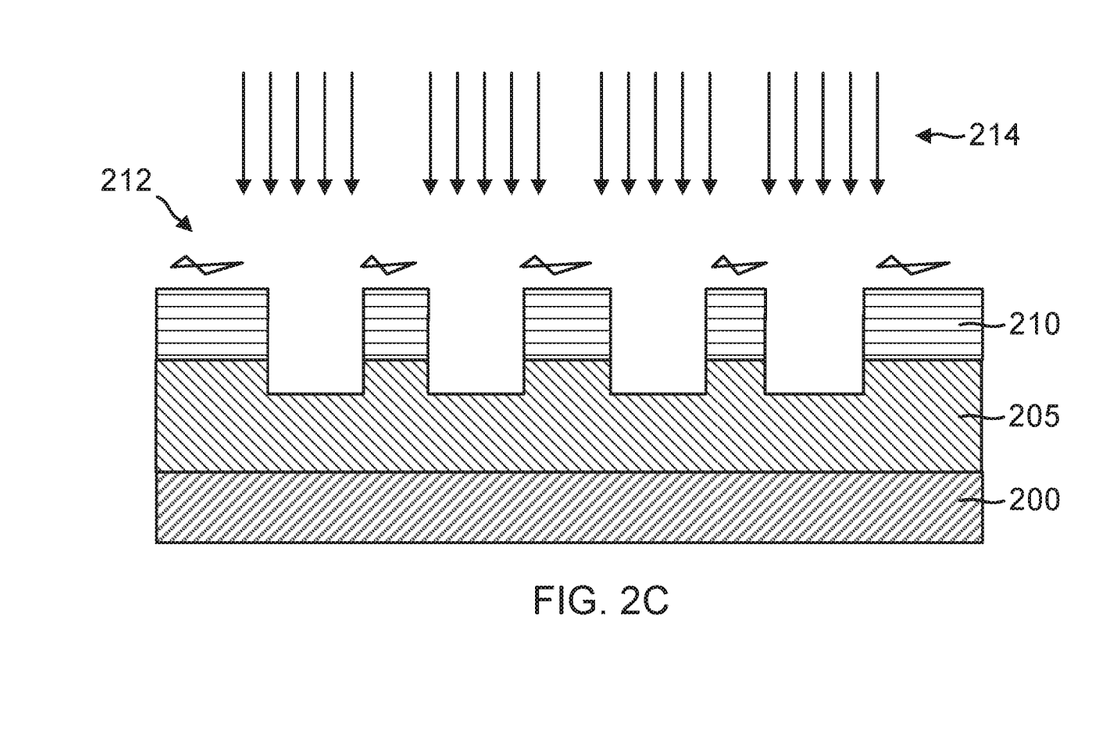

At step 106 and FIG. 2C, the dielectric layer 205 and the sacrificial layer 210 are exposed to beams 214 from a UV laser to form a pattern (e.g., vias and/or trenches) through a mask or reticle, such that all areas of the substrate 200 to be ablated are scanned by the beams 214. In various embodiments, a 193 nm, 248 nm, 308 nm, or 355 nm UV excimer laser is used, such as where mask scanning or spot shot ablation is used. The laser beams 214 are absorbed by the dielectric layer 205 and the sacrificial layer 210, and the exposed regions of the substrate 200 are ablated. This laser ablation process causes debris 212 to be ejected from the pattern and deposited on top of the sacrificial layer 210 around the ablated pattern.

Figure 2D:
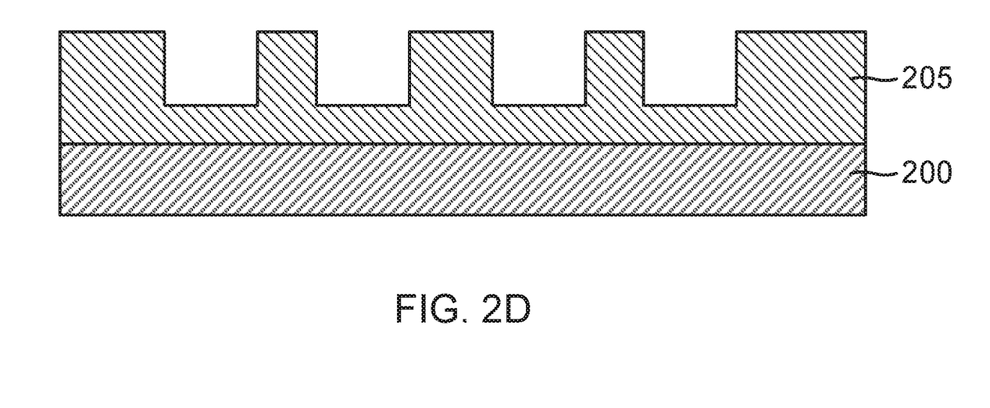

At step 108 and FIG. 2D, water is sprayed to remove both the debris 212 on the sacrificial layer 210 and the sacrificial layer 210. In another embodiment, a water bath is used to remove the sacrificial layer 210 and debris 212. The pattern and the surface of the dielectric layer 205 are left clean and debris-free for subsequent processing, such as seed layer deposition and plating. Step 108 uses conventional water spray techniques.

Advantageously, the sacrificial layer and debris are removed with just water, rather than costly or hazardous organic solvents. Moreover, the sacrificial layer is thermally stable, does not peel or lift off during patterning, and absorbs UV radiation. The sacrificial layer works for either spot shot ablation (step and repeat) or with a scan beam during an excimer laser ablation process In various embodiments, after the water is sprayed, the dielectric layer 205 is rinsed with an alcohol to further clean the dielectric layer 205 and to facilitate drying of the dielectric layer 205. In some embodiments, the dielectric layer 205 is rinsed for about 15 to about 30 seconds.

Figure 3A:
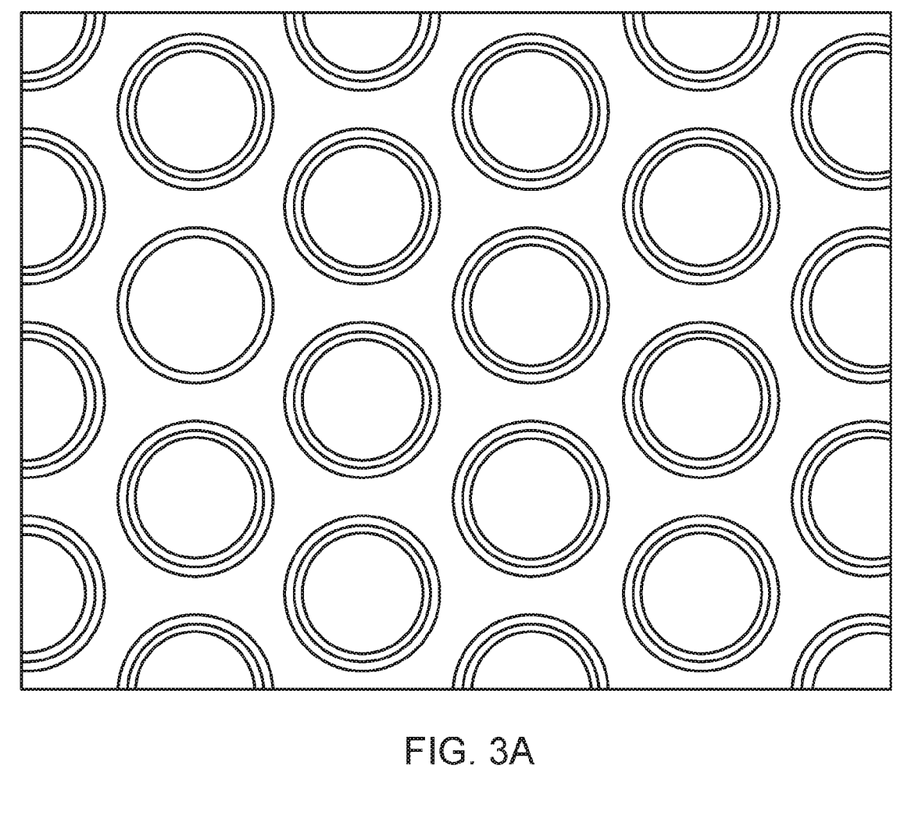
FIG. 3A illustrates a wafer after laser ablation with post-laser debris on top of a sacrificial layer in accordance with an embodiment of the present invention.
Figure 3B:
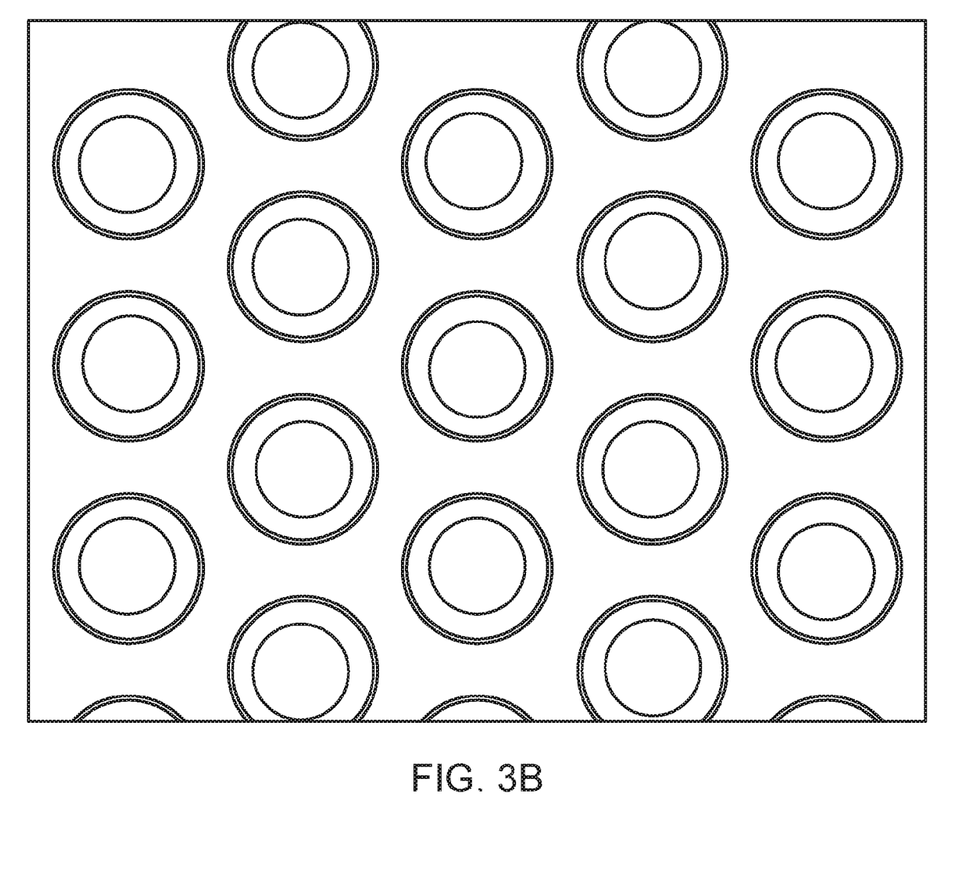
FIG. 3B illustrates the wafer of FIG. 3A after water spray cleaning where the sacrificial layer and post-laser debris are removed.

FIG. 3A illustrates a wafer post ablation with debris on top of the sacrificial layer. FIG. 3B illustrates the wafer post water spray cleaning where the sacrificial layer and debris are removed. As can be seen, with just simple water washing, the substrate is clean and clear of the debris.

Example-1

One and a half (1.5) grams of PEO was dissolved in 48.5 mL of deionized water to form a 3% solution of PEO in water (binder solution). Fifteen (15) mL of this binder solution was measured in another beaker, and 0.5 to 2 mL of Tinuvin® 400 solution (UV absorbent from BASF) was added to it. The two materials were mixed to form a whitish homogeneous solution. A wafer (100-300 mm) that had a dielectric material already coated and fully cured on it or a laminated dry film wafer was placed on a spin coater tool. A specific amount of solution was dispensed on top of the wafer, and then the wafer spun at room temperature at 2500 rpm for 30 seconds. The amount depended on the wafer size. For 100-150 mm wafers, about 5-10 mL was used. For 150-200 mm wafers, about 10-15 mL was used. For 300 mm wafers, about 15-25 mL was used. The amount dispensed on the wafer was used to ensure best coverage and a uniform film thickness. The wafer was then removed and allowed to dry using a sweep of nitrogen at room temperature. The sacrificial layer thickness formed ranged from about 0.5 to 2 microns.

Next, the coated wafer was placed on the chuck of a UV laser, and the desired features were ablated on the dielectric or laminated dry film. After ablation, the wafer was inspected for debris, feature resolution, and critical dimension. Afterwards, the wafer was loaded into a high pressure $CO_2$ ionized deionized water spray tool (SUSS MicroTec Delta12AQ). The wafer was exposed to the water spray at the following conditions: water pressure 30-50 bar, 25° C., and 1000 rpm spin for 300 seconds, followed by 60 seconds spin dry at 1500 rpm. The wafer was then inspected for debris and no residual of any material was found on top of the dielectric or laminated dry film. All the ablated features were clean.

Example-2

One and a half (1.5) grams of PEO was dissolved in 48.5 mL of deionized water to form a 3% solution of PEO in water (binder solution). Thirty (30) mL of this binder solution was measured in another beaker, and 1 to 3 mL of Tinuvin® 400 solution (UV absorbent from BASF) was added to it. The two materials were mixed to form a whitish homogeneous solution. A 200 mm wafer that had a dielectric material already coated and fully cured on it or a laminated dry film wafer was placed on a spin coater tool. About 10-15 mL of the solution was dispensed on top of the 200 mm wafer, and then the wafer spun at room temperature at 2500 rpm for 30 seconds. The wafer was then removed and allowed to dry using a sweep of nitrogen at room temperature. The sacrificial layer thickness formed ranged from about 0.5 to 2 microns.

Next, the coated wafer was placed on the chuck of a UV laser, and the desired features were ablated on the dielectric or laminated dry film. After ablation, the wafer was inspected for debris, feature resolution, and critical dimension. Afterwards, the wafer was loaded into a high pressure $CO_2$ ionized deionized water spray tool (SUSS MicroTec Delta12AQ). The wafer was exposed to the water spray at the following conditions: water pressure 30-50 bar, 25° C., and 1000 rpm spin for 300 seconds.

The wafer was then exposed to an isopropanol rinse for 30 seconds while spinning at 1500 rpm, followed by 60 seconds of spin drying at 1500 rpm. The wafer was subsequently inspected for debris and no residual of any material was found on top of the dielectric or laminated dry film. All the ablated features were clean.

Figure 4:
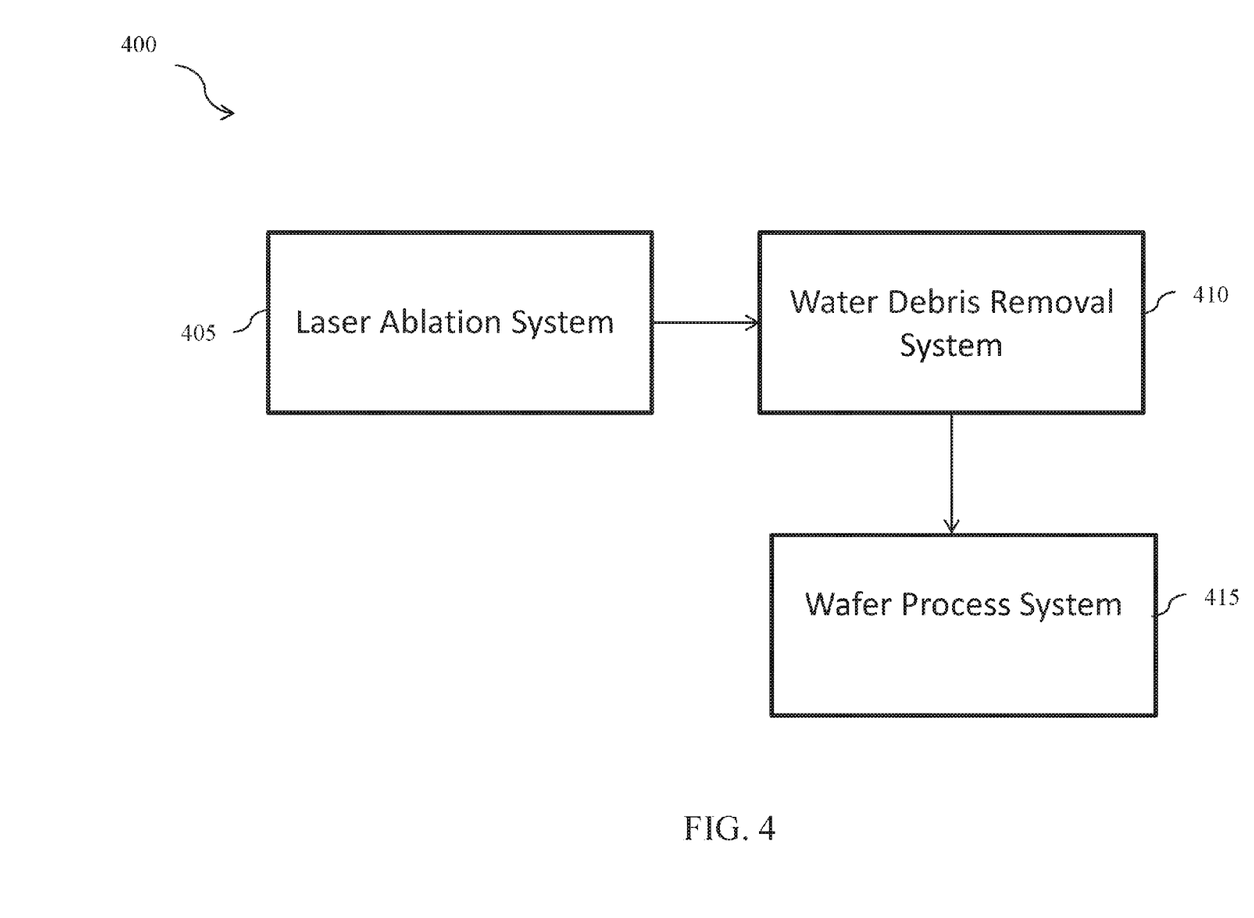
FIG. 4 illustrates a block diagram of a system for removing post-laser debris in accordance with an embodiment of the present invention.

FIG. 4 illustrates a system 400 that may be used to remove post-laser debris in accordance with one or more embodiments. System 400 includes laser ablation system 405, water debris removal system 410, and wafer process system 415. Laser ablation system 405 patterns the dielectric layer 205 and sacrificial layer 210 using a laser light source, for example, an excimer laser. Next, water is used to remove debris 212 and the sacrificial layer 210 in the water debris removal system 410. Water debris removal system 410 may include a water spray or a water bath. Once the post-laser debris 212 is removed, subsequent processing, such as seed layer deposition and plating can be performed in the wafer process system 415.

As those of skill in this art will by now appreciate, many modifications, substitutions and variations can be made in and to the materials, apparatus, configurations and methods of removing post laser debris in accordance with one or more embodiments of the present invention without departing from its spirit and scope. Accordingly, the scope of the present invention should not be limited to the particular embodiments illustrated and described herein, as they are merely by way of some examples thereof, but rather, should be fully commensurate with that of the claims appended hereafter and their functional equivalents.

What is claimed is:

1. A method of removing post-laser debris from a wafer comprising:
   forming a sacrificial layer over a layer to be patterned, wherein the sacrificial layer comprises a water soluble binder and a water soluble ultraviolet (UV) absorbent;
   patterning the sacrificial layer and the layer to be patterned using laser ablation; and
   removing the sacrificial layer and debris deposited on the sacrificial layer with water.

2. The method of claim 1, wherein the laser ablation uses an excimer laser.

3. The method of claim 2, wherein excimer laser comprises a 248 nm, 308 nm, or 355 nm excimer laser.

4. The method of claim 1, wherein the water soluble binder is selected from the group consisting of polyvinyl alcohol (PVA), polyvinylpyrrolidone (PVP), polyethylene oxide (PEO), polyacrylic materials, ethyl cellulose, methyl ester, and combinations thereof.

5. The method of claim 1, wherein the water soluble UV absorbent is selected from the group consisting of benzotriazole-based UV absorbent materials, triazine-based UV absorbent materials, and combinations thereof.

6. The method of claim 1, wherein the sacrificial layer is about 0.5 to 2 microns thick.

7. The method of claim 6, wherein the sacrificial layer is about 1 to 1.5 microns thick.

8. The method of claim 1, wherein the layer to be patterned comprises a dielectric material, glass, metal, or combinations thereof.

9. The method of claim 1, wherein a ratio of the water soluble binder to the water soluble UV absorbent in the sacrificial layer is from about 30:1 to about 5:1.

10. The method of claim 1, wherein the water soluble binder comprises polyethylene oxide (PEO) and the water soluble UV absorbent comprises a liquid hydroxyphenyltriazine.

11. The method of claim 1, wherein removing the sacrificial layer and the debris comprises spraying water on the sacrificial layer, or using a water bath.

12. The method of claim 1, further comprising rinsing the layer to be patterned with an alcohol after removing the sacrificial layer and debris with water.

13. A system for performing the method of claim 1, comprising:
   a laser ablation system;
   a water debris removal system; and
   a wafer process system.

14. A method of removing post-laser debris from a wafer comprising:
   combining a water soluble binder and a water soluble ultraviolet (UV) absorbent to form a solution;
   applying the solution on a dielectric, glass, or metal layer to form a sacrificial layer;
   patterning the sacrificial layer and the dielectric, glass, or metal layer using laser ablation; and
   removing the sacrificial layer and debris deposited on the sacrificial layer with water.

15. The method of claim 14, wherein the solution comprises about 1 to 10 percent by weight of the water soluble binder.

16. The method of claim 15, wherein the water soluble binder comprises polyethylene oxide (PEO) and the water soluble UV absorbent comprises a liquid hydroxyphenyl-triazine.

17. The method of claim 14, wherein the laser ablation uses an excimer laser.

18. The method of claim 14, wherein the water soluble binder is selected from the group consisting of polyvinyl alcohol (PVA), polyvinylpyrrolidone (PVP), polyethylene oxide (PEO), polyacrylic materials, ethyl cellulose, methyl ester, and combinations thereof.

19. The method of claim 14, wherein the water soluble UV absorbent is selected from the group consisting of benzotriazole-based UV absorbent materials, triazine-based UV absorbent materials, and combinations thereof.

20. The method of claim 14, wherein the sacrificial layer is about 1 to 1.5 microns thick.

21. The method of claim 14, further comprising rinsing the dielectric, glass, or metal layer with an alcohol after removing the sacrificial layer and debris with water.

22. A system for performing the method of claim 14, comprising:
   a laser ablation system;
   a water debris removal system; and
   a wafer process system.

23. The method of claim 14, wherein the solution is applied on the dielectric layer and the laser ablation uses an excimer laser.

24. The method of claim 23, wherein the water soluble binder comprises polyethylene oxide (PEO) and the water soluble UV absorbent comprises a liquid hydroxyphenyl-triazine.

25. The method of claim 24, wherein a ratio of the polyethylene oxide to the liquid hydroxyphenyl-triazine in the sacrificial layer is from about 30:1 to about 5:1.

26. The method of claim 23, wherein the sacrificial layer is about 1 to 1.5 microns thick.

27. The method of claim 23, further comprising rinsing the dielectric layer with an alcohol after removing the sacrificial layer and debris with the water spray.

28. A system for performing the method of claim 23, comprising:
   a laser ablation system;
   a water debris removal system; and
   a wafer process system.

* * * * *